US005668487A

United States Patent [19]
Chonan

[11] Patent Number: 5,668,487
[45] Date of Patent: Sep. 16, 1997

[54] CIRCUIT DETECTING ELECTRIC POTENTIAL OF SEMICONDUCTOR SUBSTRATE BY COMPENSATING FLUCTUATION IN THRESHOLD VOLTAGE OF TRANSISTOR

[75] Inventor: Toru Chonan, Tokyo, Japan

[73] Assignee: NEC Corporation, Tokyo, Japan

[21] Appl. No.: 358,105

[22] Filed: Dec. 16, 1994

[30] Foreign Application Priority Data

Dec. 17, 1993 [JP] Japan .................................. 5-318690

[51] Int. Cl.$^6$ .................................................. H03K 5/22
[52] U.S. Cl. .............................. 327/80; 327/77; 327/78; 327/534; 327/537
[58] Field of Search .............................. 327/77, 78, 80, 327/534, 536, 537

[56] References Cited

U.S. PATENT DOCUMENTS

| | | | |
|---|---|---|---|
| 4,337,378 | 6/1982 | Davis | 327/78 |
| 4,794,278 | 12/1988 | Vajdic | 327/537 |
| 4,961,167 | 10/1990 | Kumanoya et al. | 327/534 |
| 5,113,088 | 5/1992 | Yamamoto et al. | 327/536 |
| 5,243,228 | 9/1993 | Maruyama et al. | 327/534 |
| 5,270,584 | 12/1993 | Koshikawa et al. | 327/534 |
| 5,341,035 | 8/1994 | Shibayama et al. | 327/537 |

FOREIGN PATENT DOCUMENTS 5-54650  3/1993  Japan .

*Primary Examiner*—Terry Cunningham
*Attorney, Agent, or Firm*—Whitham, Curtis, Whitham & McGinn

[57] ABSTRACT

A substrate potential detection circuit includes a substrate potential detection unit including a first transistor having a gate and a source connected respectively to a ground line and a reference voltage line, a second transistor having a gate receiving a substrate potential and a drain connected to the ground, and a third transistor having a source connected to the drain of the first transistor and a gate and a drain connected in common to the source of the second transistor to form a detection output node; and a buffer circuit having a drive transistor and a current source, a gate and a source of the drive transistor being connected respectively to the detection output node and the reference voltage line and outputting a substrate detection voltage.

10 Claims, 5 Drawing Sheets

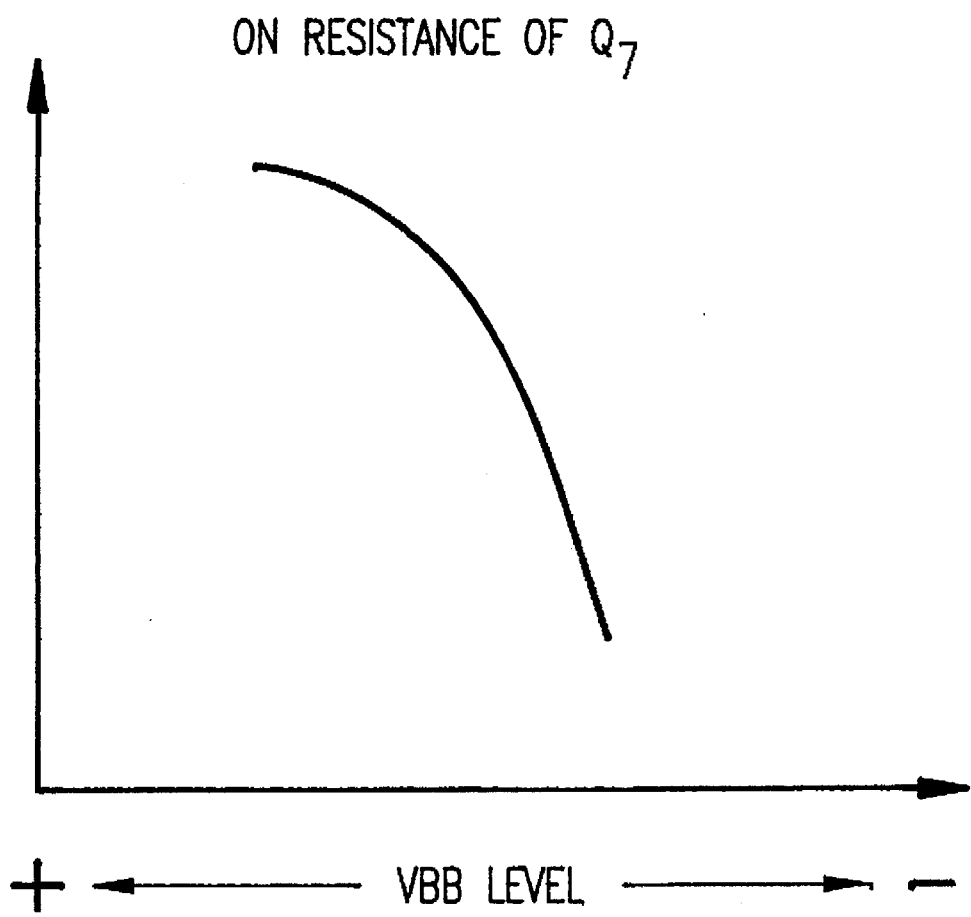

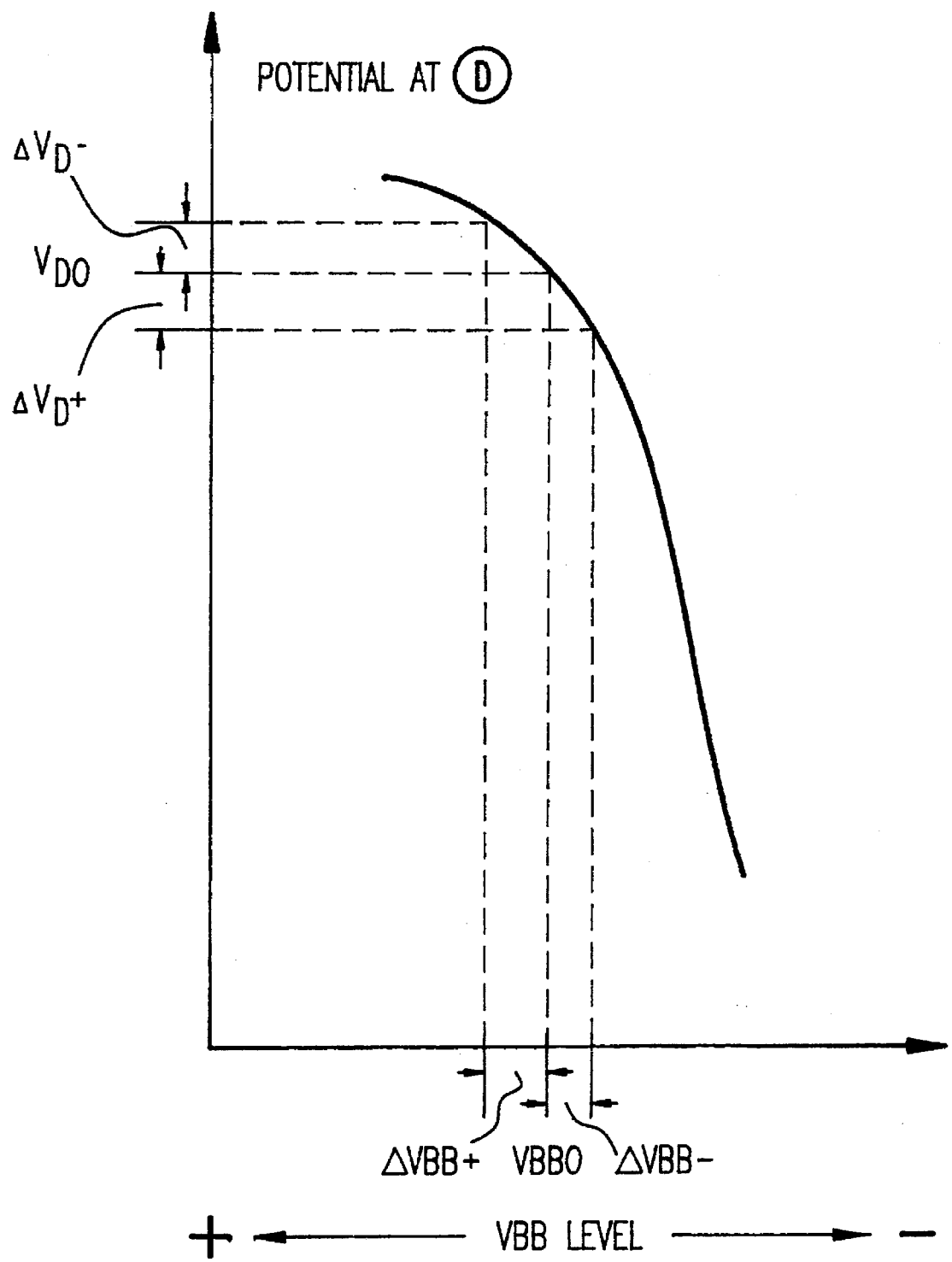

CIRCUIT DETECTING ELECTRIC POTENTIAL OF SEMICONDUCTOR SUBSTRATE BY COMPENSATING FLUCTUATION IN THRESHOLD VOLTAGE OF TRANSISTOR

FIELD OF THE INVENTION

This invention relates to a circuit detecting an electric potential of a semiconductor substrate and, more particularly, to such a circuit employed in a dynamic memory device to detect an electric potential of a semiconductor substrate in which a dynamic memory circuit is formed.

BACKGROUND OF THE INVENTION

In a dynamic memory device, an electric potential of a semiconductor substrate is required to be lower than a reference potential or a ground potential for the purposes of reducing a sub-threshold leakage current in a cell transistor and preventing the so-called latch-up phenomenon. To this end, a charge pumping circuit is generally employed to generate and supply such a potential to the substrate. A substrate potential detection circuit is further provided to control the charge pumping circuit, as disclosed in Japanese Patent Application (Kokai) Hei 5-54650.

In this prior art technique, the substrate potential detection circuit detects the substrate potential and controls the charge pumping circuit such that the charge pumping circuit is activated if the substrate potential is detected to be higher than a predetermined level (hereafter called "pre-set level") and deactivated if the substrate potential is lower than the pre-set level. The substrate potential is thus maintained at the pro-set level.

Referring to FIG. 4, the substrate potential detection circuit of the prior art comprises a P-channel MOS transistors Q6 and Q7 connected in series between a reference voltage line VREF and a ground line GND to divide the reference voltage VREF and supply a divided voltage to a node D. The transistor Q8 has a gate connected to GND and the transistor Q7 has a gate applied with a substrate potential VBB which is supplied to a semiconductor substrate (not shown). In addition, a P-channel MOS transistor Q8 with a gate connected to the node D, an N-channel MOS transistor Q9 with a gate connected to the reference voltage VREF and an inverter 10, which are connected as shown, constitute a buffer outputting a substrate detection signal EBBG. The reference voltage VREF is kept constant irrespective of a power supply voltage VCC.

The detection signal EBBG is employed to activate and deactivate a charge pumping circuit (not shown). That is, the charge pumping circuit is activated when the logic level of the output EBBG value is "1" and deactivated when the signal EGGB is at "0". The logic level of the output EBBG is in turn determined by the ratio of the current drive capability of the transistor Q8 to that of the transistor Q9. The current drive capability of the transistor Q8 is dependent on the source-gate voltage $V_{CS}$ of the transistor Q8.

More specifically, since the N-channel transistor Q9 is so arranged as to have a relatively small current capability, the potential at a node E is pulled approximately up to VREF level when the source-gate voltage $V_{CS}$ of the P-channel transistor Q8 is greater than a threshold voltage $|V_{TP}|$ of the transistor Q8 by a small level α (ex. α is 100 to 200 mV). As a result thereof, as shown in FIG. 5, the output signal EBBG is set to "1" and "0" when the source-gate voltage $|V_{CS}|$ of the transistor Q8 is $|V_{CS}|<|V_{TP}|+\alpha$ and $|V_{CS}|\leq|V_{TP}|+\alpha$, respectively.

By adjusting a ratio of channel width W of the transistor Q6 to that of the transistor Q7, the source-gate voltage $|V_{CS}|$ of the transistor Q8 may be set to satisfy the following equation when the substrate potential VBB is at the pre-set level, $$|V_{CS}|=VREF-VD=|V_{TP}|+\alpha$$

where VD denotes the electric potential at the voltage dividing node D.

If the substrate potential VBB becomes higher than the pre-set level, the current flowing through the transistor Q7 is decreased so that the potential VD at the node D is increased. The reason is that the transistor Q6 operates as a resistive element so that the voltage drop thereacross is enlarged by the increase of the current flowing through the transistor Q6. As a result, the P-channel transistor Q8 is rendered non-conductive when the source-gate voltage of the transistor Q8 becomes smaller than $|V_{TP}|+\alpha$. Since the N-channel transistor Q9 is in a conductive state, the potential at the output node E is lowered to the ground level to switch the output EBBG from "0" to "1" for activating the charge pumping circuit.

On the other hand, if the reference potential VBB level is lower than the pre-set level, the current flowing through the transistor Q7 is increased. As a result, the potential VD at the voltage dividing node D is lowered so that the source-gate voltage of the transistor Q8 is made to satisfy the condition of $|V_{CS}|>|V_{TP}|+\alpha$ the transistor Q8 being thereby brought into a conductive state. The potential at the output node E is thus pulled up to the VREF level to switch the output EBBG from "1" to "0" for deactivating the charge pumping circuit.

The above-described conventional substrate potential detection circuit is constructed such that the potential at the node D is dependent on the substrate potential VBB to determine the activation and deactivation of the charge pumping circuit when the source-gate voltage $|V_{CS}|$ of the transistor Q8 is $|V_{CS}|<|V_{TP}|+\alpha$ and $|VG_s|<|V_{TP}|+\alpha$, respectively.

As a result, the detection level of the substrate potential VBB is directly affected by the fluctuation in the threshold voltage $|V_{TP}|$ of the transistor Q8 caused by the fluctuation in the manufacturing process.

Referring to FIG. 6 and FIG. 7, the above-mentioned problems will be explained in detail. The characteristic curve shown in FIG. 6 indicates the dependence of the ON resistance of the transistor Q7 on the substrate potential VBB.

Since the source-gate voltage $|V_{CS}|$ of the transistor Q7 is represented by VD-VBB, the lower the reference potential VBB becomes, the lower the ON resistance becomes such that the characteristic curve becomes more sharply-inclined (ex. as for Schottky model, the curve shown in FIG. 6 may be of a quadratic one). The characteristic curve shown in FIG. 7 indicates these matters in respect to the relation between the potential at the node D (Y-axis) and the substrate potential VBB (X-axis). In FIG. 7, same as FIG. 6, as the substrate potential VBB becomes low, the potential at the node D is lowered and the characteristic curve is more sharply-inclined.

Assuming that the pre-set level of the substrate potential VBB is VBB0 and that the corresponding potential VD at the node D is VD0 (see FIG. 7), VD0 is the potential of the node D at which the output EBBG is inverted.

If the threshold voltage $|V_{TP}|$ of the transistor Q8 is fluctuated by $\pm\Delta V_{TP}$, the potential at the node D and the substrate potential VBB for inverting the output EBBG are given as VDO+ΔV$_{TP}$=VD+, and VBBO+ΔVBB+/ ΔVBB−, respectively (see FIG. 7).

That is, the level shift in the detection level of the substrate potential from the pro-set level VBB0 by ΔVBB+ or ΔVBB− is caused by the fluctuation ±ΔV$_{TP}$ in the threshold voltage |V$_{TP}$| of the transistor Q8. ΔVBB+ and ΔVBB− denote level shifts of the substrate potential VBB in positive and negative directions respectively.

As shown in FIG. 7, ΔVBB+ is usually greater than ΔVBB−. The circuit simulation for the device adopting the 0.4-μm design rule, indicates that ΔVBB− is 0.15 V and ΔVBB+ is 0.27 V, assuming that VBB0=−1.5 V and ΔV$_{TP}$= ±0.1 V respectively.

If the potential of the substrate is shifted to higher level direction by a large amount, that is, ΔVBB+ is large, the sub-threshold leakage and the latch-up phenomenon in the cell transistors of the dynamic memory device as well as the latch-up phenomenon or the like in periphery circuit thereof may occur.

SUMMARY OF THE INVENTION

It is, therefore, an object of the present invention to provide an improved substrate potential detection circuit.

It is another object of the present invention to provide a substrate potential detection circuit employed in a dynamic memory device, which circuit can suppress the shift of a detection level caused substantially by the fluctuation of the threshold voltage of a transistor and prevent the occurrence of a sub-threshold leakage current and latch-up phenomenon in cell transistors.

A detection circuit according to the present invention is featured by comprising, in addition to a basic structure of the conventional circuit, level shift compensating circuit for compensating deviation in a threshold voltage of a transistor.

BRIEF DESCRIPTION OF THE DRAWINGS

The foregoing and other objects, features, and advantages of the invention will be apparent from the following more particular description of preferred embodiments of the invention taken in conjunction with the accompanying drawings, in which

FIG. 6 is a diagram illustrating the dependence of the transistor Q7 ON resistance on the substrate potential of the circuit shown in FIG. 4; and FIG. 7 is a diagram illustrating the relation between the potential at the node D and the substrate potential in the circuit shown in FIG. 4, as well as the changes when the threshold voltage VT is varied.

DETAILED DESCRIPTION OF THE PREFERRED EMBODIMENTS

Figure 1:
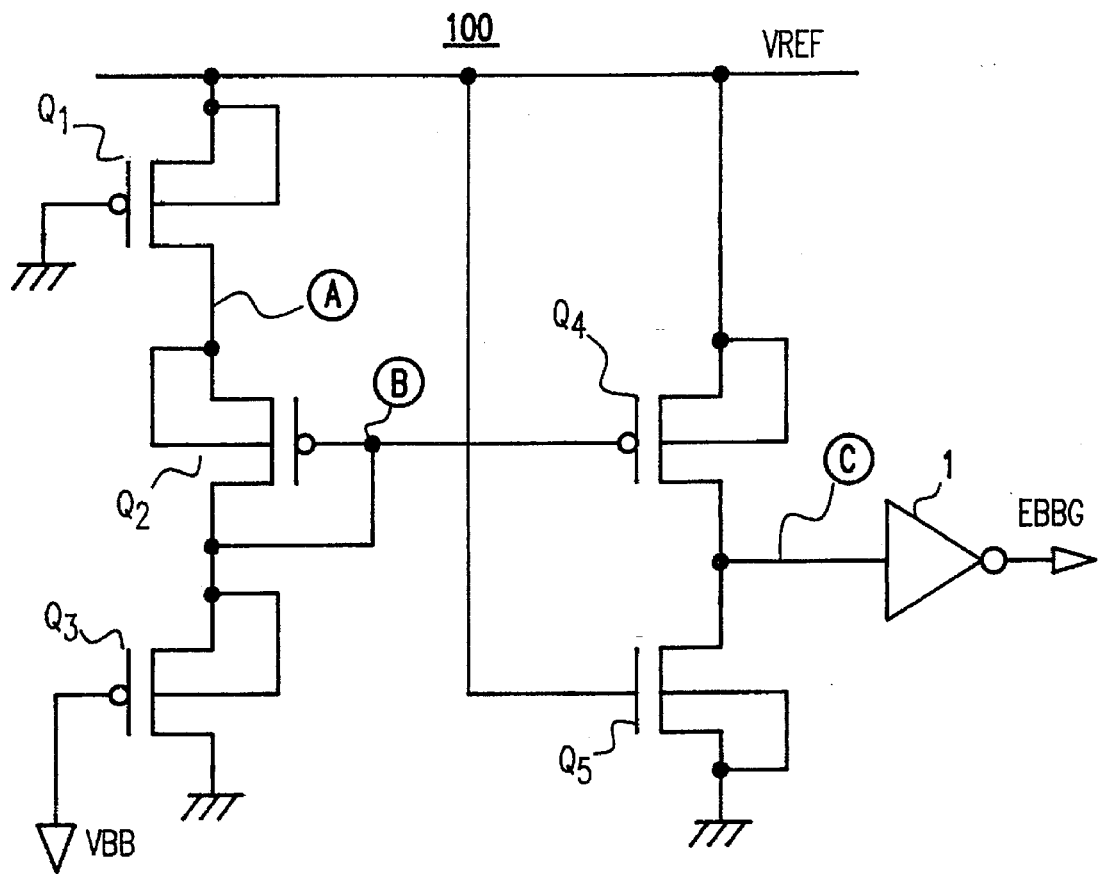
FIG. 1 is a circuit diagram showing a substrate potential detection circuit according to an embodiment of the present invention.

Referring now to FIG. 1, a substrate potential detection circuit 100 according to the embodiment of the present invention includes transistors Q1, Q2 and Q3 each of a P-channel connected in series in that order between a reference voltage line supplied with a reference potential VREF, and the ground line. The transistor Q2 is connected in a diode fashion. The drain of the transistor Q1 and the source of the transistor Q2 are connected at a node A, while the drain of the transistor Q2 and the source of the transistor Q3 are connected at a node B. The gate of the transistor Q1 is connected to the GND line and the gate of the transistor Q3 receives a substrate potential VBB which is supplied to a semiconductor substrate (not shown) on which a dynamic memory circuit (also not shown) is formed together with this circuit 100. This circuit 100 further has a P-channel MOS transistor Q4 and an N-channel MOS transistor Q5 connected in series between the reference potential VREF line and the ground line. The gate of the transistor Q4 is connected to the gate of the transistor Q2 at a node B, and the gate of the transistor Q5 is connected to the reference line VREF to thereby maintain the transistor Q5 conductive. The connection node C of the transistors Q4 and Q5 is connected to an inverter of which in turn generates a detection output signal EBBG.

The transistor Q2 is designed to have a current driving capability larger than those of the transistors Q1, Q3 and Q4. The reference voltage VREF is generated by the so-called band-gap-regulator and thus kept constant irrespective of a power supply voltage VCC.

The output signal EBBG is supplied as a control signal to a charge pumping circuit (not shown) generating the substrate potential VBB. That is, the charge pumping circuit is activated and deactivated when the logic value of the output signal EBBG is "1" and "0", respectively. The logic level of the output signal EBBG is in turn determined by the ratio of the current driving capability of the transistor Q4 to that of the transistor Q5. This ratio is dependent on the source-gate voltage |V$_{CS}$| of the transistor Q4. Thus, the output signal EBBG changes in logic level whether or not the source-gate voltage |V$_{CS}$| of the transistor Q4 is greater than the threshold voltage |V$_{TP}$| by α (α is 100 mV to 200 mV in this embodiment). In other words, the output signal EBBG becomes "1" and "0" when |V$_{CS}$|≦|V$_{TP}$|+α and |V$_{CS}$|>|V$_{TP}$|+α, respectively.

Assuming that the current flowing through the transistors Q1, Q2 and Q3 is "I" and that the ON resistance values of the transistors Q1 and Q3 are indicated by R1 and R3, respectively, the following relationships are derived with respect to voltages of the respective nodes (see also FIG. 3):

VREF−VA=I·R1

VA−VB=V$_{TP}$

VB−GND=I·R3 where V$_{TP}$ denotes the threshold voltage of the transistor Q2 and VA and VB denotes potentials at the nodes A and B, respectively.

In the present embodiment, the threshold voltage V$_{TP}$ of the P-channel transistor Q2 is designed to be the same as that of the P-channel transistor Q4, and the ratio of the channel width W of the transistor Q1 to that of the transistor Q3 is adjusted such that I·(R1) is equal to α of when the substrate potential VBB is equal to the pre-set level. Under this condition, when the ON resistance R3 of the transistor Q3 is increased due to the fact that the reference potential VBB becomes higher than the pre-set level, the potential VB at the node B is raised. The source-gate voltage of the transistor Q4 is thus made to satisfy the following condition;

|V$_{CS}$|<|V$_{TP}$|+α

Figure 2:
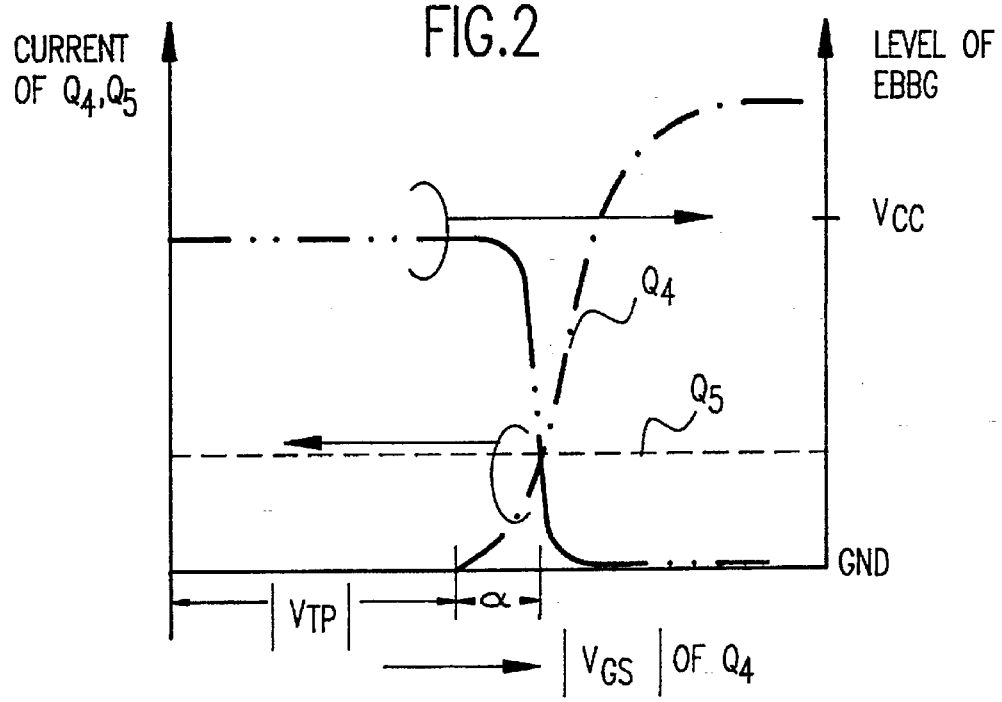
FIG. 2 is a diagram illustrating an operation of the circuit shown in FIG. 1.

As a result, the output signal EBBG becomes "1", as shown in FIG. 2. The charge pumping circuit is thereby activated by the "1"-level signal EBBG to raise up the substrate potential VBB.

On the contrary, when the reference potential VBB is lower than the pre-set level, the ON resistance R3 is decreased, so that the potential VB at the node B becomes low to satisfy the following condition;

$$|VGS|>|VTP|+\alpha$$

The output signal EBBG is thereby changed to "0" to deactivate the charge pumping circuit. The substrate potential VBB is then lowered.

Figure 4:
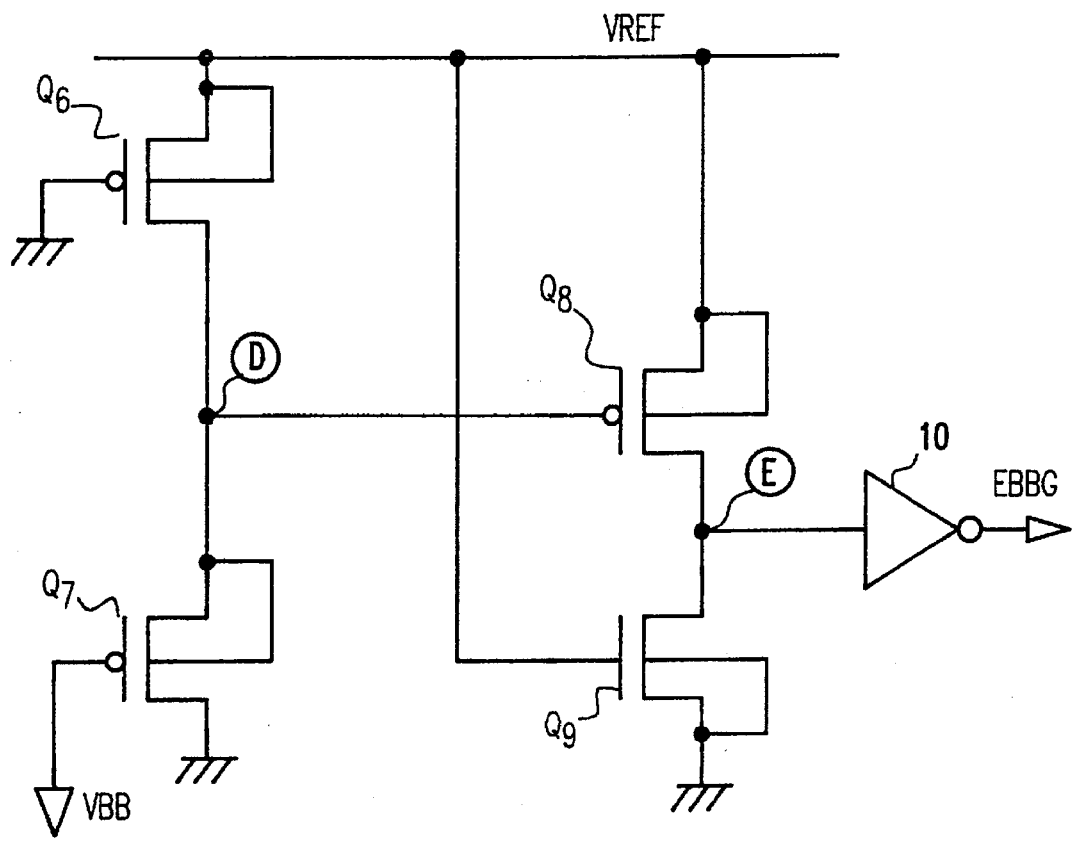
FIG. 4 is a circuit diagram showing a substrate potential detection circuit of the prior art.
Figure 5:
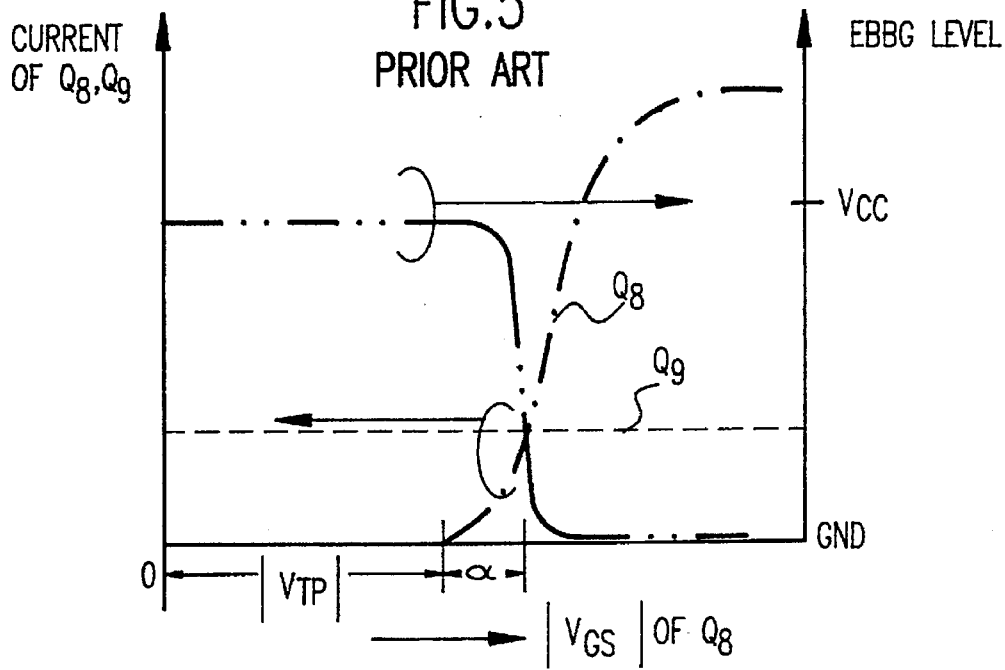
FIG. 5 is a diagram illustrating the operation of the circuit shown in FIG. 4.

In the prior art substrate detection circuit (FIG. 4), if the threshold voltage $V_{TP}$ of the P-channel transistor Q8 is fluctuated by $\pm\Delta V_{TP}$ due to the process variation in the manufacturing, the source gate voltage $|V_{CS}|$ of the transistor Q8 is displaced from $|V_{TP}|+\alpha$ to $|V_{TP}|\pm\Delta V_{TP}+\alpha$ to have the detection level shift.

Figure 3:
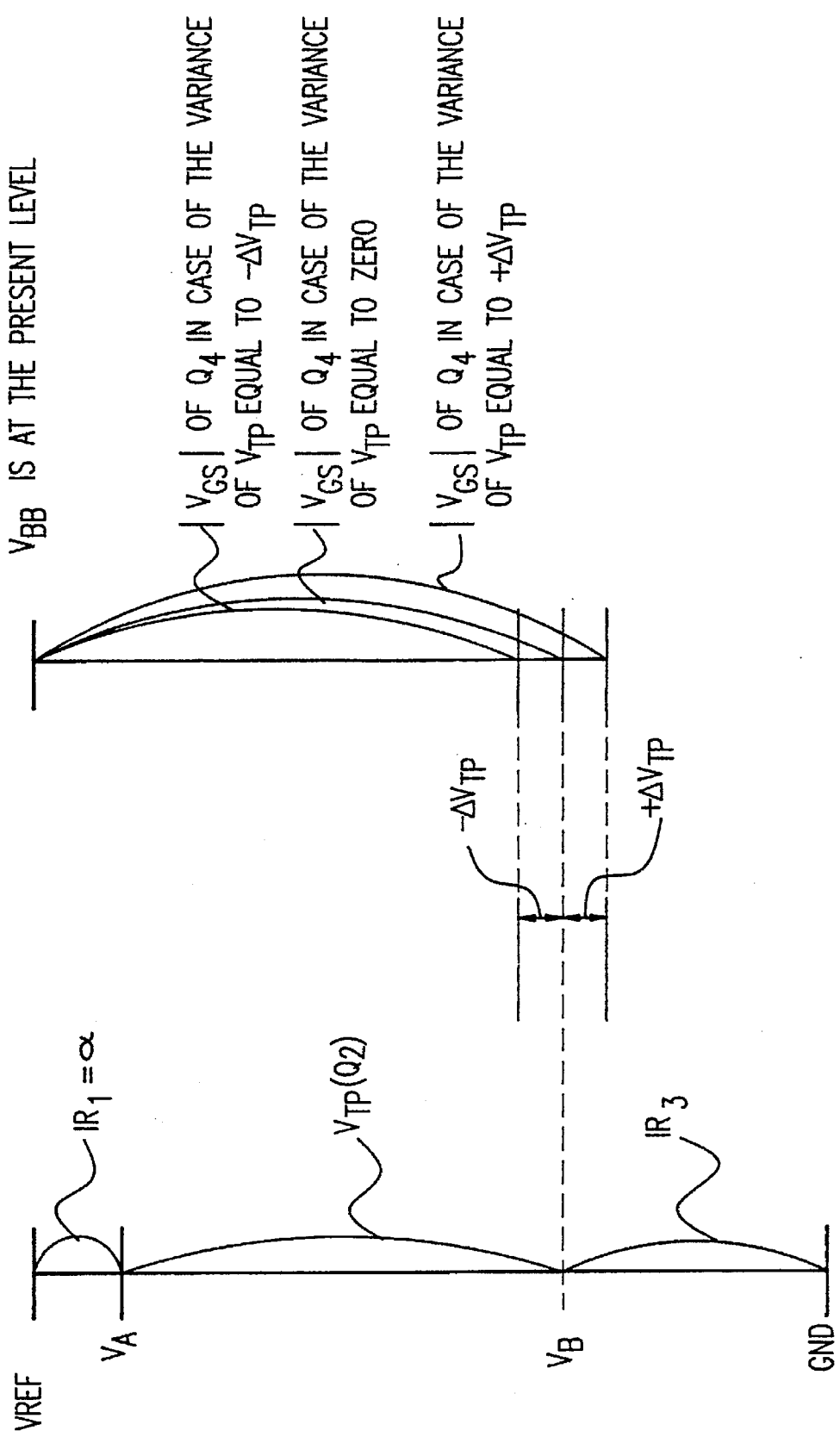
FIG. 3 is a potential diagram illustrating potentials of the respective nodes of the circuit shown in FIG. 1.

In the substrate potential detection circuit according to the present embodiment on the other hand, if the threshold voltage $V_{TP}$ of the P-channel transistor Q4 is fluctuated, the threshold voltage of the P-channel transistor Q2 is also fluctuated by the same amount $\pm\Delta V_{TP}$ and in the same direction as that of the transistor Q4. This is because the transistors Q2 and Q4 are fabricated simultaneously. The potential VB at the node B is also displaced by $\pm\Delta V_{TP}$ (see FIG. 3). Accordingly, even if the threshold voltage $V_{TP}$ of each P-channel transistor is fluctuated, the transistor Q4 is made to satisfy the following condition, $$|V_{CS}|=|V_{TP}|\pm\Delta V_{TP}+\alpha$$

when the reference potential VBB is at the pre-set level, as shown in FIG. 3, so that the detection level of the substrate potential is never affected by the fluctuation in threshold voltage $V_T$ of the transistor.

Although the threshold voltages of the transistors Q2 and Q4 are designed to be the same value as each other, the threshold voltage $V_{TP}$ of the drive transistor Q4 in the substrate potential detection circuit can be made to be higher than the threshold voltage of the transistor Q2. Also in this example, the output signal EBBG is inverted when the reference potential VBB is at the pro-set level by adjusting the ratio of the channel width W of the transistor Q1 to that of the transistor Q3.

As apparent from the foregoing, the substrate potential detection circuit according to the invention maintains its detection level irrespective of fluctuation in threshold voltage to thereby realize a stable circuit which can prevent the occurrence of a sub-threshold leakage current, latch-up phenomenon or the like of cell transistors as well as a peripheral circuit in the dynamic memory circuit.

As many apparently widely different embodiments of the present invention can be made without departing from the spirit and scope thereof, it is to be understood that the invention is not limited to the specific embodiments thereof except as defined in the appended claims.

What is claimed is:

1. A detection circuit for detecting whether a bias potential is larger than a predetermined level, comprising:

first and second reference voltage lines;

a first transistor having a source-drain path connected between said first reference voltage line and a first node, and a gate connected to said second reference voltage line;

a second transistor having a gate receiving said bias potential and a source-drain path connected between said second reference voltage line and a second node;

a third transistor having a source-drain path connected between said first and second nodes and a gate connected to said second node;

a fourth drive transistor having a source-drain path connected between said first reference voltage line and an output node and a gate connected to said second node; and a current source connected between said output node and said second reference voltage line, said third transistor having a same conductivity type as that of said fourth drive transistor to compensate for a variation in threshold level of said fourth drive transistor.

2. The circuit as defined in claim 1, wherein each of said first, second, and third transistors and said fourth drive transistor comprise P-channel type.

3. The circuit as defined in claim 1, wherein said third transistor has a threshold voltage larger in absolute value than a threshold voltage of said fourth drive transistor.

4. The circuit as defined in claim 1, wherein said fourth transistor has a threshold voltage larger in absolute value than a threshold voltage of said third transistor.

5. A dynamic memory voltage level detecting circuit compensating for deviation in a threshold voltage level of a drive transistor, said detecting circuit for controlling a predetermined circuit for the dynamic memory, comprising:

a first transistor, a second transistor, and a third transistor connected in series between a reference voltage line and electrical ground, said first transistor having a gate connected to electrical ground, and said second transistor having a gate connected to a junction of said second transistor and said third transistor, said third transistor having a gate connected to a substrate containing a dynamic memory for detecting a potential of the substrate;

a fourth drive transistor, and a fifth transistor connected in series between said reference voltage line and electrical ground, said fourth drive transistor having a gate connected to a gate of said second transistor, said fifth transistor having a gate connected to said reference voltage line such that said fifth transistor maintains a conducting state; and an output signal line connected between said fourth drive transistor and said fifth transistor, said second transistor and said fourth drive transistor having a same threshold voltage, such that when said gate of said third transistor detects a high potential on the substrate, said output signal line activates the predetermined circuit, and when said gate of said third transistor detects a low potential on the substrate, said output signal line deactivates the predetermined circuit.

6. A dynamic memory voltage level detecting circuit as recited in claim 5 wherein said second transistor and said fourth drive transistor comprise p-type transistors.

7. A dynamic memory voltage level detecting circuit as recited in claim 6 wherein, if the threshold voltage of said second transistor is fluctuated, the threshold voltage of said fourth transistor is fluctuated by an equal amount.

8. A dynamic memory voltage level detecting circuit as recited in claim 5 wherein said first, said second, and said third transistors comprise p-type transistors.

9. A dynamic memory voltage level detecting circuit as recited in claim 5 wherein said fifth transistor is n-type.

10. A dynamic memory voltage level detecting circuit as recited in claim 5, further comprising an inverter connected to said output signal line.

* * * * *